(12) United States Patent
Krohn et al.

(10) Patent No.: US 9,374,918 B2
(45) Date of Patent: *Jun. 21, 2016

(54) STAND ASSEMBLIES FOR PORTABLE ELECTRONIC DEVICES

(71) Applicant: JTK ENTERPRISES, Fort Collins, CO (US)

(72) Inventors: James T Krohn, Fort Collins, CO (US); Craig B Stucko, Commack, NY (US)

(73) Assignee: JTK Enterprises, Fort Collins, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/499,066

(22) Filed: Sep. 26, 2014

(65) Prior Publication Data

US 2015/0189771 A1  Jul. 2, 2015

Related U.S. Application Data

(63) Continuation of application No. 13/244,612, filed on Sep. 25, 2011, now Pat. No. 8,857,773.

(51) Int. Cl.
| | | |
|---|---|---|
| A47F 5/00 | (2006.01) |
| H05K 5/02 | (2006.01) |
| F16M 11/10 | (2006.01) |
| F16M 13/00 | (2006.01) |
| G06F 1/16 | (2006.01) |
| H05K 5/00 | (2006.01) |

(52) U.S. Cl.
CPC ............. *H05K 5/0204* (2013.01); *F16M 11/10* (2013.01); *F16M 11/105* (2013.01); *F16M 13/00* (2013.01); *G06F 1/166* (2013.01); *G06F 1/1632* (2013.01); *H05K 5/0086* (2013.01)

(58) Field of Classification Search
CPC ..... F16M 13/00; F16M 11/105; F16M 11/10; G06F 1/1632; G06F 1/166
USPC ........ 248/121, 127, 176.1, 176.3, 441.1, 451, 248/454, 460, 463, 444, 447, 469, 472, 476, 248/370, 371, 393, 395, 396, 397, 274.1, 248/309.1; 40/478, 479, 745, 748
See application file for complete search history.

(56) References Cited

U.S. PATENT DOCUMENTS

| | | | | |
|---|---|---|---|---|
| 7,168,672 B2 * | 1/2007 | Hsu | ............................... | 248/444 |
| 7,758,009 B1 * | 7/2010 | Chang | ........................... | 248/460 |
| 8,162,282 B2 * | 4/2012 | Hu et al. | ....................... | 248/447 |
| 8,162,283 B1 * | 4/2012 | Royz et al. | .................... | 248/455 |
| 8,328,153 B2 * | 12/2012 | Yang et al. | .................... | 248/370 |
| 8,413,943 B1 * | 4/2013 | Li | ................................ | 248/454 |
| 8,662,465 B2 * | 3/2014 | Huang | ........................... | 248/371 |
| 8,720,837 B2 * | 5/2014 | Li et al. | ....................... | 248/188.6 |
| 8,857,773 B2 * | 10/2014 | Krohn | ................... | G06F 1/1632 206/756 |
| 8,960,421 B1 * | 2/2015 | Diebel | .................. | G06F 1/1679 206/320 |
| 2010/0072334 A1 * | 3/2010 | Le Gette | ............. | F16M 11/041 248/176.3 |
| 2012/0170194 A1 * | 7/2012 | Lord et al. | ............... | 361/679.02 |
| 2013/0048520 A1 * | 2/2013 | Garrett | ...................... | A45F 5/00 206/320 |
| 2013/0097907 A1 * | 4/2013 | Krohn et al. | ................... | 40/761 |

\* cited by examiner

*Primary Examiner* — Todd M Epps

(57) ABSTRACT

Adjustable stand assemblies for portable electronic devices are provided, which allow portable electronic devices to stand-alone in multiple incline positions in both portrait and landscape orientations.

19 Claims, 12 Drawing Sheets

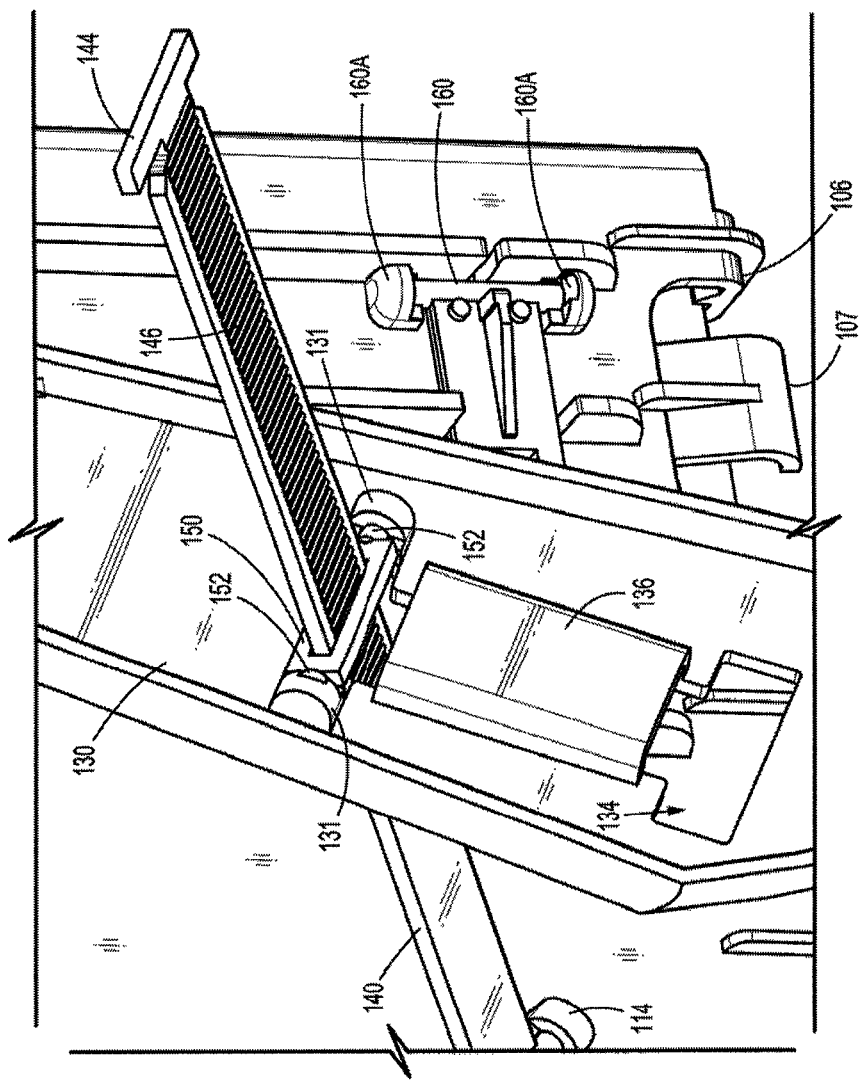

STAND ASSEMBLIES FOR PORTABLE ELECTRONIC DEVICES

CROSS-REFERENCE TO RELATED APPLICATION

This is a Continuation of U.S. patent application Ser. No. 13/244,612, filed on Sep. 25, 2011, the disclosure of which is incorporated herein by reference.

TECHNICAL FIELD

This invention generally rotates to stand assemblies for portable electronic devices and, more specifically, to adjustable stand assemblies that allow portable electronic devices to stand-alone in multiple incline positions in both portrait and landscape orientations.

BACKGROUND

There are a variety of commercially available device holders and stand assemblies for use with mobile phones, PDAs and other types of portable electronic devices. These device holders and stand assemblies cover various designs that provide different functions such as protecting, restraining and enabling hands free use of specific electronic devices. Many designs have limited versatility.

For instance, many commercially available stand assemblies are designed for use in either landscape or portrait viewing of the display screens of the electronic devices, but not both, which limits functional versatility. Indeed, many electronic devices such as iPads and iPhones, for example, are designed with GUI (graphical user interface) screens that are automatically adjusted to landscape or portrait viewing mode depending on the orientation of the device. With stand assemblies that enable only portrait or landscape orientation, hands-free viewing of portable electronic devices with both portrait and landscape screen displays is not possible. Moreover, for stand assembly designs that do allow both portrait and landscape orientations, the stand support structures are typically complex and complicated and require a user to physically adjust the stand assembly structure for either portrait or landscape orientation.

Another disadvantage to some commercially available stand assembly designs is that the incline angle of the stand is limited to one angle and cannot be adjusted. This limits versatility of use of the stand assembly in certain instances where hands free viewing of a portable electronic device would be useful at a relatively flat incline angle to properly view the display screen when, for instance, the user is in close proximity to the device and looking down at the device, or in other instances, where the user is relatively far from the device or the device is disposed at a position relatively close to eye level where a higher incline angle would be useful to properly view the display screen.

Therefore, it is desirable to provide a more functional stand assembly for electronic devices such as electronic tablet computers, mobile phones, PDAs, and other portable electronic devices, which would provide a more versatile adjustable support assembly enabling adjustment over a wide range of viewing angles in both landscape and/or portrait orientations.

SUMMARY OF THE INVENTION

Exemplary embodiments of the invention generally include stand assemblies for portable electronic devices. More specifically, exemplary embodiments or the invention include adjustable stand assemblies that allow portable electronic devices to stand-alone in multiple incline positions in both portrait and landscape orientations.

In one exemplary embodiment, a stand assembly for a portable electronic device includes a support frame and an adjustable kickstand assembly. The support frame has a plurality of resilient clamping elements configured to removably couple a portable electronic device to a front surface of the support frame. The adjustable kickstand assembly is coupled to a rear surface of the support frame. The adjustable kickstand assembly comprises a kickstand element that is adjustable from a stowed position to at least one deployed angular position relative to a rear surface of the support frame, wherein in the at least one deployed angular position, the stand assembly can be positioned in either a landscape orientation or a portrait orientation without having to change the at least one deployed angular position of the adjustable kickstand assembly.

In another exemplary embodiment, the adjustable kickstand assembly includes an adjuster bar element, and an adjuster bar lock element. The adjuster bar lock element is pivotally connected to the kickstand element, and the adjuster bar element slideably engages the adjuster bar lock element to adjust an incline angle of the adjustable kickstand relative to the rear surface of the support frame.

In one exemplary embodiment, the kickstand element is an easel-leg-type support element having first and second contact edges, which make contact with a support surface when the stand assembly is deployed in a landscape orientation and to portrait orientation, respectively.

These and other embodiments, aspects, and features of the present invention will become apparent from the following detailed description of exemplary embodiments, which is to be read in conjunction with the accompanying figures.

BRIEF DESCRIPTION OF THE DRAWINGS

FIG. 7 is an exploded view of the adjustable kickstand assembly shown in FIG. 4 in a deployed position, according to an exemplary embodiment of the invention.

DETAILED DESCRIPTION OF EXEMPLARY EMBODIMENTS

Figure 1:
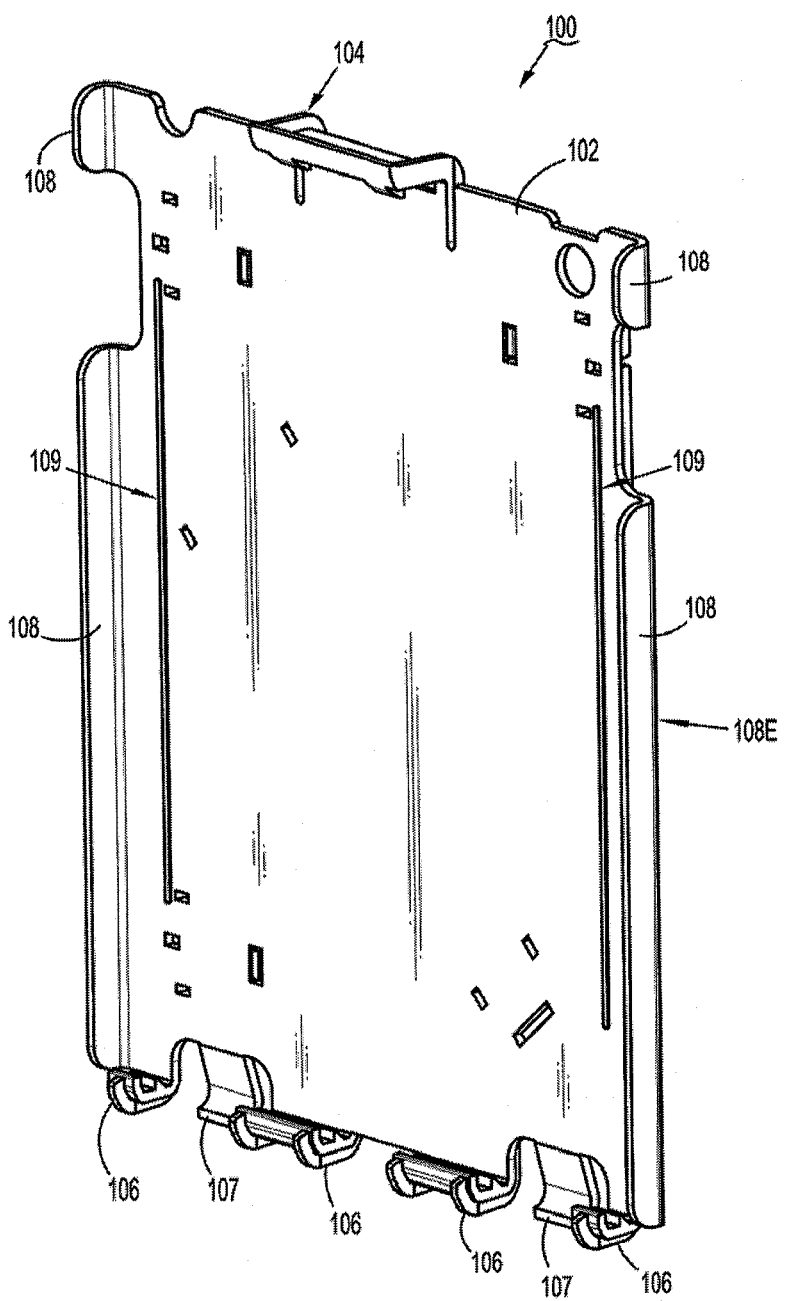
FIG. 1 is a front perspective view of an adjustable stand assembly according to an exemplary embodiment of the invention.
Figure 2:
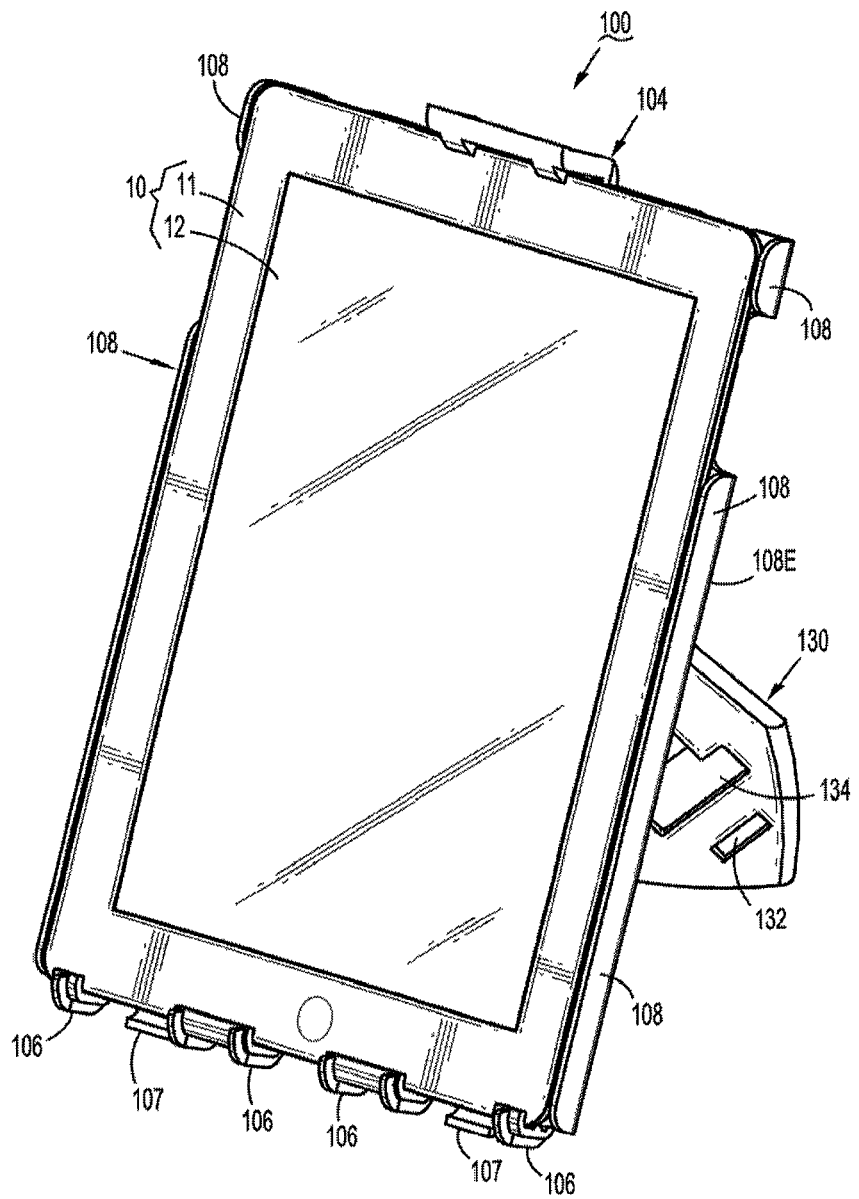
FIG. 2 is a front perspective view of the adjustable stand assembly having an electronic device coupled thereto according to exemplary embodiment of the invention.
Figure 3:
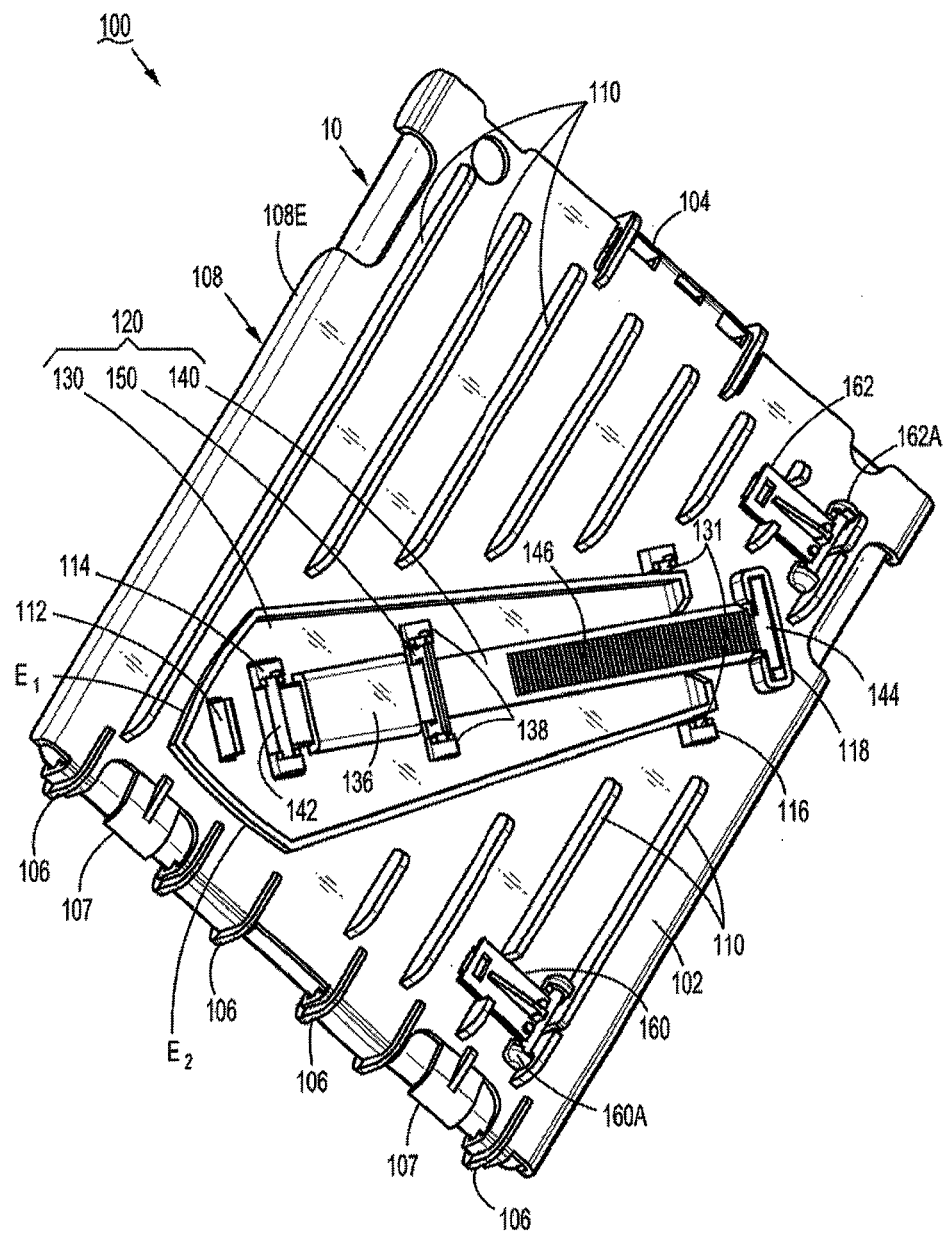
FIG. 3 is a rear perspective view of the adjustable stand assembly of FIG. 1, showing an adjustable kickstand assembly in a stowed position, according to an exemplary embodiment of the invention.

Exemplary embodiments of the invention will now be described in further detail with reference to adjustable stand assemblies that allow portable electronic devices to stand-alone in multiple incline positions in both portrait and landscape orientations. Initial reference is made to FIGS. 1, 2, 3, and 4, which show different perspective views of an adjustable stand assembly (100) according to an exemplary embodiment of the invention. In particular, FIG. 1 is a front perspective view of the adjustable stand assembly (100), and FIG. 2 is as front perspective view of the adjustable stand assembly (100) having an electronic device (10) coupled to a front surface of the adjustable stand assembly (100). FIG. 3 is a rear perspective view of the adjustable stand assembly (100) of FIG. 1 showing an adjustable kickstand assembly (120) in a stowed position, and FIG. 4 is a rear perspective view of the adjustable stand assembly (100) showing the adjustable kickstand assembly (120) in a deployed incline position with the adjustable stand assembly (100) in a portrait orientation.

As general shown in FIGS. 1-4, the stand assembly (100) comprises a support frame (102) having a plurality of clamping elements (104) and (106) for securing an electronic device (10) to a front side of the support frame (102) (or frame) and protective sidewall elements (108) to protect side edges of the electronic device (10) mounted thereto. FIG. 2 schematically illustrates as generic electronic device (10) comprising a frame/cover (11) and a display screen (12). For illustrative purposes, the electronic device (10) is generically depicted as an electronic tablet computer, such as an iPAD device, but it is to be understood that stand assemblies according to principles of the invention may be designed for use with various types of portable devices such as mobile phones, e-readers, and other known types of PDA (personal digital assistant) devices.

The clamping elements (104) and (106) are shown disposed on a first set of opposing sides of the support fame (102) and sidewalk (108) are shown disposed on a second set of opposing sides of the support frame (102). The clamping elements (104) and (106) are integrally molded as part of the support frame (102) and designed to impart a resilient bias against opposing edges of the electronic device (10) to securely seat and clamp the electronic device (10) in place within the support frame (102) without obstructing the view of the display screen (12) of the device (10). In one exemplary embodiment of the invention, the sidewalk (108) are integrally molded as part of the support frame (102), and do not impart any resilient clamping force, but serve to protect the side edges of the device (10). In other exemplary embodiments, the formation of the clamping elements (104) and (106) and protective sidewalls (108) may vary in size, shape and positioning depending on the specific electronic device used, as is understood by those of ordinary skill in the art.

Figure 4:
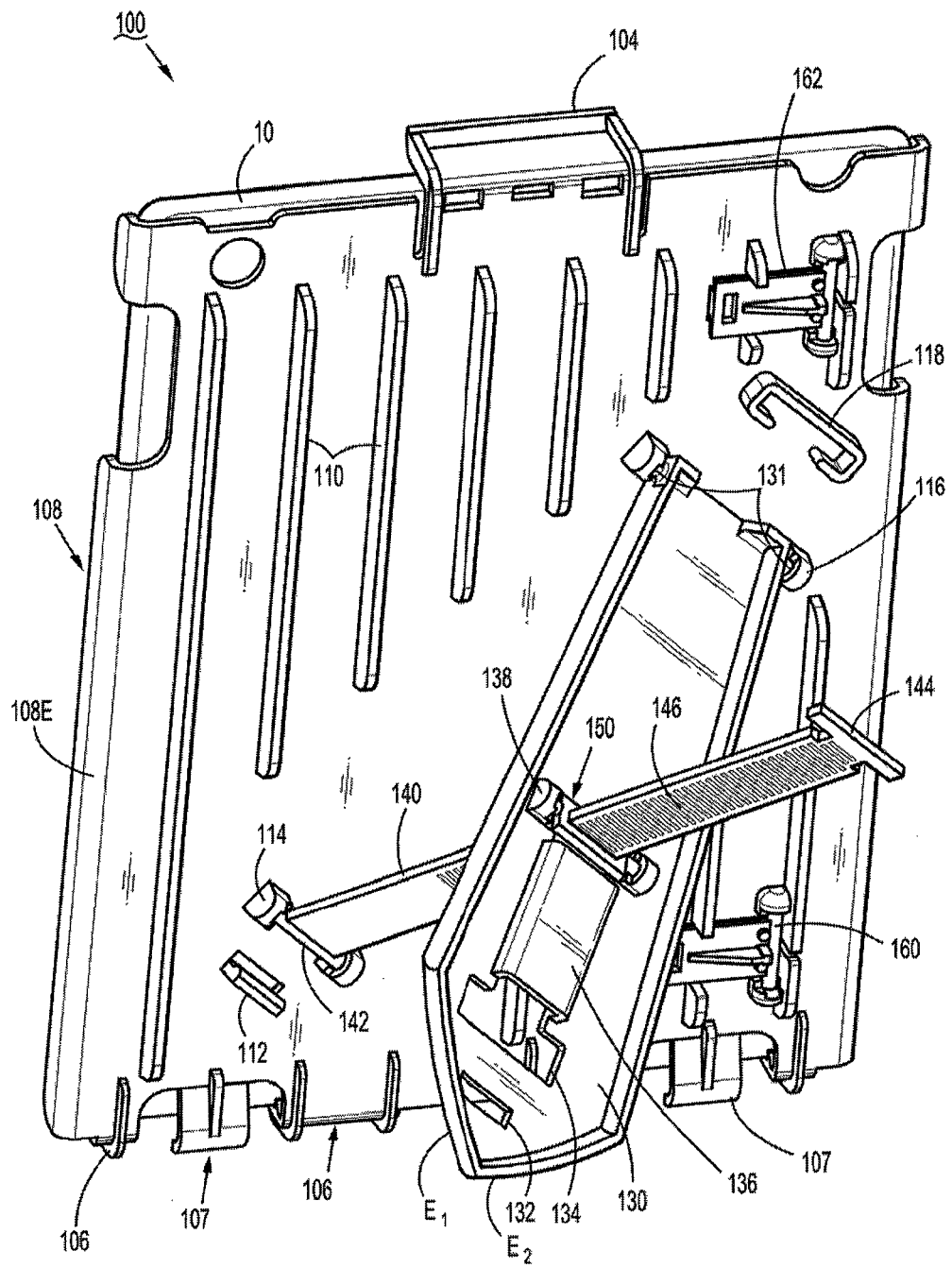
FIG. 4 is a rear perspective view of the adjustable stand assembly of FIG. 1 having the adjustable kickstand assembly in a deployed incline position with the adjustable stand assembly in a portrait orientation, according to an exemplary embodiment of the invention.

Furthermore, as shown in FIGS. 3 and 4, for example, a rear surface of the support frame (102) includes, in general, a series of longitudinally extending raised edges (110) (or ribs), a clamp connector element (112), a first pivot connector element (114), a second pivot connector element (116), and as cradle connector element (118). As further shown in FIGS. 3 and 4, the adjustable kickstand assembly (120) comprises a kickstand element (130), an adjuster bar element (140), and an adjuster bar lock element (150). The rear surface of the support frame (102) also includes a plurality of "keyboard riser" elements (160) and (162) that are pivotally connected to the rear surface of the support frame (102) via respective pivot connector elements (160A) and (162A). The keyboard riser elements (160) and (162) may be deployed with the adjustable kickstand assembly (120) in the stowed position (as shown in FIG. 3), to provide a low incline angle (e.g., 8 degrees) when the stand assembly (100) is positioned in a landscape orientation and when, for instance, the electronic device (10) displays a keyboard for typing, thereby providing an ergonomic design for ease of typing.

In general, the adjustable kickstand assembly (120) permits landscape or portrait viewing and angular adjustment in both landscape and portrait orientation over as wide range of incline angles. The kickstand element (130) comprises an easel-leg-type support element having contact edges E1 and E2 which make contact with a support surface when the adjustable kickstand (120) is deployed in a landscape orientation (see, e.g. FIG. 6) and a portrait orientation (see, e.g., FIGS. 4 and 5), respectively. The kickstand element (130) includes opposing protruding pin elements (131), which are removably inserted into the second pivot connector element (116), so that the kickstand element (130) is pivotally connected to the rear surface of the support frame (102).

The kickstand element (130) further comprises as first aperture (132), as second aperture (134), a raised element (136) and a pivot connector element (138). The first aperture (132) insertably and resiliently receives the clamp connector element (112) to hold the kickstand element (130) down in a stowed position, as specifically depicted in FIG. 3. The second aperture (134) is a cutout in the kickstand element (130) to insertably receive the first pivot connector element (114) and an end portion of the adjuster bar element (140), so that the kickstand element (130) can lay that against the rear surface of the support frame (102) when in the stowed position, as shown in FIG. 3. The raised element (136) is a raised, offset portion of the kickstand element (130) which covers a portion of the second aperture (134). The raised element (136) serves to provide added strength and structural integrity to the kickstand element (130), to compensate for any diminished strength that may occur by virtue of the cutout size of the aperture (134).

Figure 8A:
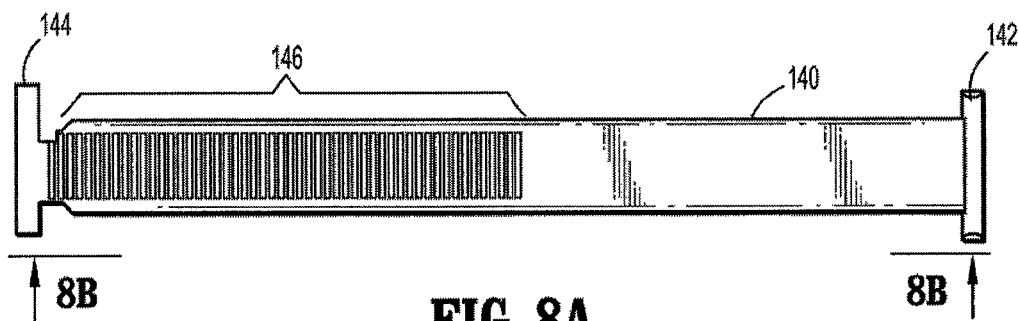
FIG. 8A is a plan view of an adjuster bar of an adjustable kickstand assembly, according to an exemplary embodiment of the invention.

The adjuster bar (140) comprises an axial pin element (142) integrally formed on one end thereof (see also FIG. 8A). The axial pin element (142) is removably inserted into the first pivot connector element (114), so that the adjuster bar (140) is pivotally connected to the rear surface of the support frame (102). The adjuster bar (140) further comprises a t-shaped tab element (144) integrally formed on another end thereof (see also FIG. 8A). The t-shaped tab element (144) is removably inserted into the cradle connector element (118) to removably hold the end portion of the adjuster bar element (140) when the kickstand assembly (120) is in the stowed position, such as shown in FIG. 3.

Figure 5:
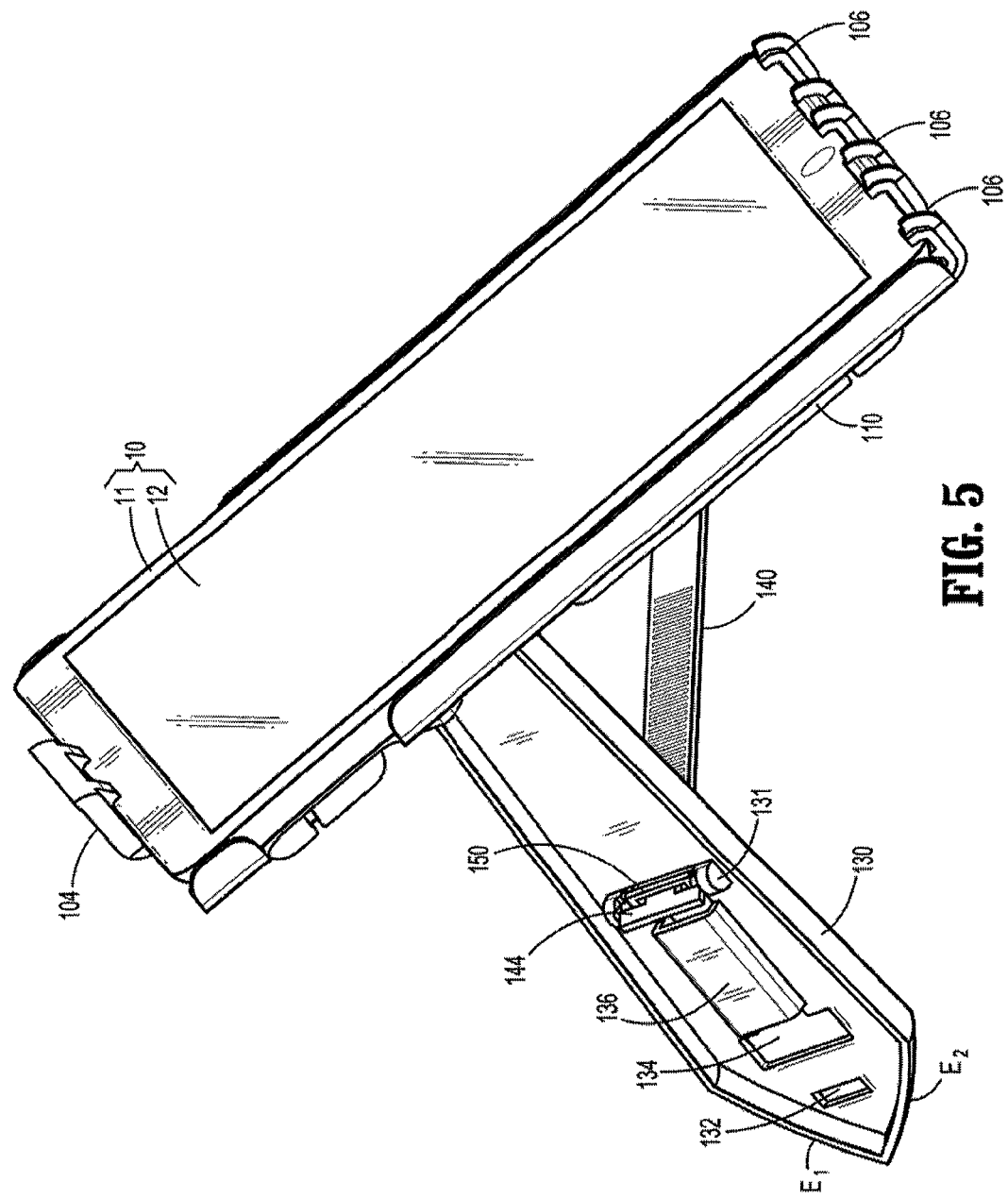
FIG. 5 is a side perspective view of the adjustable stand assembly of FIG. 1 having the adjustable kickstand assembly in another deployed incline position with the adjustable stand assembly in a portrait orientation, according to an exemplary embodiment of the invention.

The cradle connector element (118) comprises a raised edge element with a perimeter that is shaped to provide an inner region that is substantially the same size and shape as the tab element (144). The cradle connector element (118) imparts a small frictional force against the side edges of the tab element (144) to hold/cradle the tab element (144) in place when engaged with the cradle connector element (118). As further explained below, the tab element (144) also serves as a stop edge when the kickstand assembly (120) is deployed in a maximum angular inclination (as shown in FIG. 5).

In general, the adjuster bar element (140) and the adjuster bar lock element (150) operatively cooperate to provide an angle positioning mechanism to adjust an inclination angle of the kickstand element (130) when the stand assembly (100) is deployed in either a landscape or portrait orientation. As shown in FIGS. 4 and 7, for example, the adjuster bar (140) slideably engages the adjuster lock (150) through an aperture (154) of the adjuster lock (150) (see also FIGS. 9A and 9B). An exemplary mode of operation of the adjuster bar (140) and the adjuster bar lock (150) will now be described in farther detail with reference to FIGS. 8A, 8B, 9A and 9B.

Figure 8B:
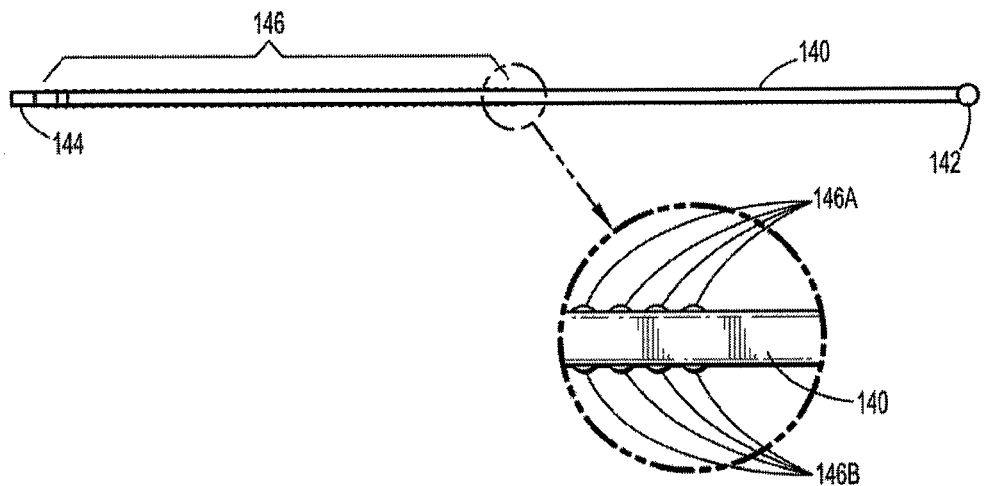
FIG. 8B is a side view of the adjuster bar taken along line 8B-8B of FIG. 8A according to an exemplary embodiment of the invention.

FIG. 8A is a plan view of the adjuster bar (140) of the adjustable kickstand assembly, according to an exemplary embodiment of the invention, and FIG. 8B is a side view of the adjuster bar (140) taken along line 8B-8B of FIG. 8A. As depicted in FIGS. 8A and 8B, in addition to the axial pin element (142) and tab element (144) formed on end portions of the adjuster bar (140) as discussed above, the adjuster bar (140) comprises a slotted region (146) comprising a series of parallel raised edges or decent (146A) on one side surface of the adjuster bar (140) and a series of parallel raised edges or detents (146B) on an opposing side surface of the adjuster bar (140).

As specifically depicted in FIG. 8B, the series of raised edges/detents (146A) and (146B) are aligned to each other on opposing side surfaces of the adjuster bar (140). The series of raised edges/detents (146A) and (146B) form parallel-aligned slots (i.e., spaces between adjacent edges (146A) and (146B)) on both sides of the adjuster bar (140). These slots operate in conjunction with the adjuster bar lock (150) to provide a locking positioning mechanism to adjust an inclination angle of the kickstand element (130) relative to the rear surface of the support frame (102). This locking mechanism will be further explained, with reference to FIGS. 9A and 9B.

Figure 9A:
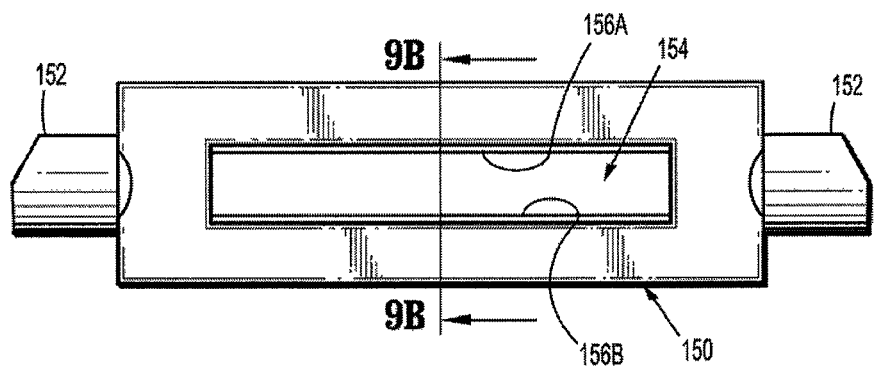
FIG. 9A is a schematic side view of an adjuster bar lock of an adjustable kickstand assembly, according to an exemplary embodiment of the invention.
Figure 9B:
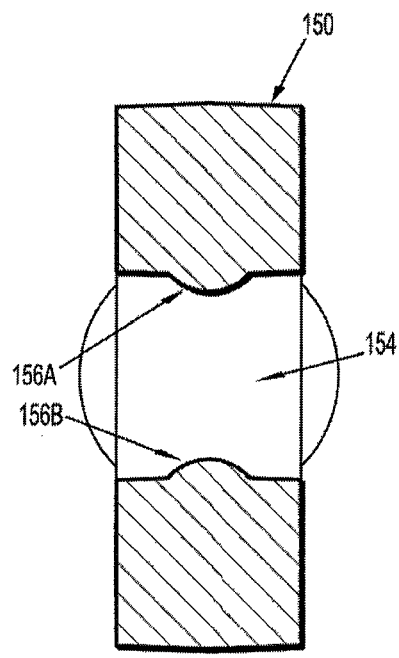
FIG. 9B is a schematic cross-sectional view of the adjuster bar lock taken along line 9B-9B of FIG. 9A, according to an exemplary embodiment of the invention.

FIG. 9A is a schematic side view of the adjuster bar lock (150) of the adjustable kickstand assembly (120) and FIG. 9B is a schematic cross-sectional view of the adjuster bar lock (150) taken along line 9B-9B of FIG. 9A. As shown in FIGS. 9A and 9B, the adjuster bar lock element (150) comprises protruding pin elements (152) that are formed on each side of the lock element (150), and an aperture (154) which insertably and slideably receives the adjuster bar element (140). The pin elements (152) are used to pivotally connect the adjuster bar lock element (150) to the pivot connector element (138) on the kickstand (130) so that the adjuster bar lock (150) moves in pivotal motion relative to the kickstand element (130) as the angle of the kickstand element (130) relative to a rear surface of the support frame (102) is adjusted by sliding the adjuster bar (140) back and forth through the aperture (154) of the adjuster bar lock (150).

As further shown in FIGS. 9A and 9B, a first raised edge (156A) and a second raised edge (156B) are formed on upper and lower inner surfaces of the aperture (154), respectively. As shown in FIG. 9B, the first and second raised edges (156A) and (156B) preferably have a rounded profile. As the slotted region (146) of the adjuster bar (140) is manually slid back and forth through the aperture (154) of the adjuster bar lock (150) when a user is adjusting the angle of the kickstand element (130), the first raised edge (156A) on the upper inner surface of the aperture (154) of the adjuster lock (150) operates to engage the slotted regions (or spaces) between the series of parallel raised edges/detents (146A) on the one side surface of the adjuster bar (140), while the second raised edge (156B) on the bottom inner surface of the aperture (154) operates to engage the slotted regions (or spaces) between the series of parallel raised edges/detents (146B) on the opposing side surface of the adjuster bar (140).

It is to be appreciated that the engagement of the raised inner edges (156A) and (156B) with slots/spaces formed between the series of detents (146A) and (146B) advantageously provides an indexed sliding motion along the slotted region (146) of the adjuster bar (140) for adjusting the inclination angle of the kickstand element (130) at various angles. For instance, FIG. 4 is a rear perspective view of the stand assembly (100) in a portrait orientation, wherein the adjustable kickstand assembly (120) is adjusted at a relatively large incline angular position. In this position, the adjuster bar (140) is locked in position by the adjuster bar lock (150) at a beginning point of the slotted region (146) of the adjuster bar (140). In this deployed position, the stand assembly (100) enables hands free viewing of the electronic device (10) at a high incline angle (e.g., 70 degrees) relative to the supporting surface. FIG. 7 is an exploded view the adjustable kickstand assembly in a deployed position shown in FIG. 4, showing engagement between the slotted region (146) of the adjuster bar (140) and the adjuster bar lock (150).

FIG. 5 is a side perspective view of the stand assembly (100) in a portrait orientation, wherein the adjustable kickstand assembly (120) is adjusted at a relatively smaller incline angular position (as compared to FIG. 4). In this position, the adjuster bar (140) is locked in position by the adjuster bar lock (150) at an end point of the slotted region (146) of the adjuster bar (140), i.e., at the tab element (144) end oldie adjuster bar (140), wherein the tab element (144) serves as a stop edge to prevent the adjuster bar (140) from disengaging from the adjuster bar lock element (150). In this deployed position, the stand assembly (100) enables hands free viewing of the electronic device (10) at a lower incline angle (e.g., 45 degrees) relative to the supporting surface.

It is to be appreciated that the slotted region (146) of the adjuster bar (140) provides an indexed angle adjustment mechanism to adjust the kickstand (130) and obtain an inclination angle of the stand assembly (100) relative to the contact surface, over a wide range of angles. For example, in one exemplary embodiment, the inclination angle may be adjusted over a range from about 70 degrees to about 45 degrees, with angular incremental changes of 0.5 degrees. In one preferred embodiment, the adjustor bar (140) and slotted region (146) are designed so that the inclination angle of the stand assembly (100) relative to the surface it stands on is preferably adjustable over a range from about 65 degrees to about 50 degrees, with angular incremental changes of 0.3 degrees.

Figure 6:
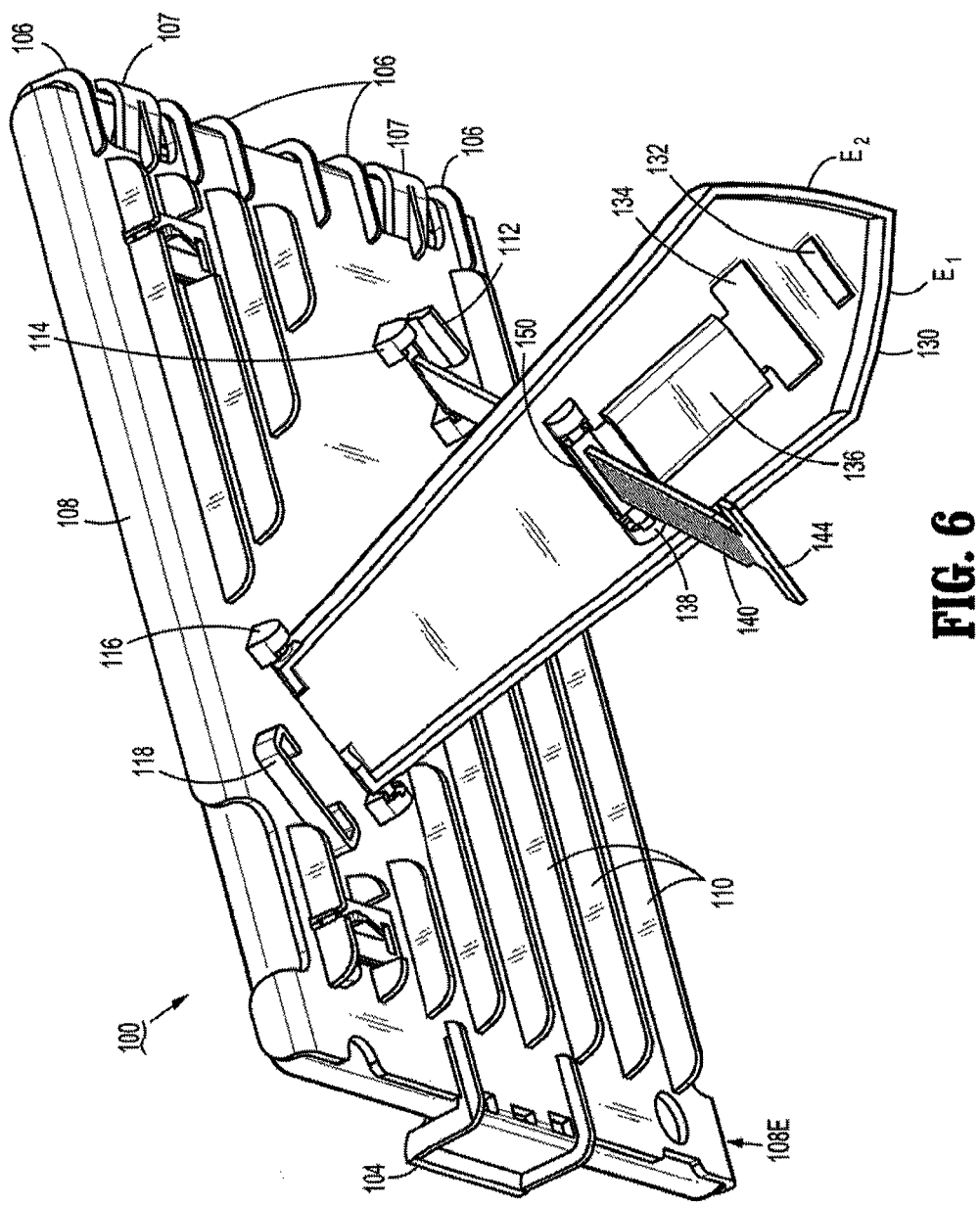
FIG. 6 is a rear perspective view of the adjustable stand assembly of FIG. 1 having the adjustable kickstand assembly in as deployed incline position with the adjustable stand assembly in a landscape orientation, according to an exemplary embodiment of the invention.

While FIGS. 4, 5, and 7 are perspective views that illustrate the stand assembly (100) in a portrait orientation, it is to be appreciated that without further adjustments needed, the stand assembly can be simply rotated 90 degrees from the portrait orientation to place the stand assembly (100) in a landscape orientation. For example, FIG. 6 is a rear perspective view of the stand assembly (100) having the adjustable kickstand assembly (120) in a deployed incline position with the stand assembly (100) in a landscape orientation.

It is to be appreciated that with one adjusted angular position between the adjustment bar (140) and lock element (150), the stand assembly (100) can be positioned in either a landscape or portrait orientation, without have to make any further adjustments to the kickstand assembly (120). Indeed, in the landscape orientation as shown in FIG. 6, the bottom edge E1 of the kickstand (130) contacts the support surface, while in a portrait orientation as shown in FIG. 4, the bottom edge E2 of the kickstand (130) contacts the support surface. FIGS. 4 and 6 illustrate the adjustable kickstand assembly (120) being adjusted to a given inclination angle, wherein the given adjustment is the same (no adjustment needed) for the stand assembly (100) when the stand assembly is placed in the portrait orientation of FIG. 4 or the landscape orientation of FIG. 6.

It is to be appreciated that in either landscape or portrait orientation, a plurality of non-skid features are provided to prevent the stand assembly (100) from slipping or sliding along a contact surface on which the stand assembly (100) sits. For example, as shown in FIGS. 1, 2, 3 and 4, for example, a plurality of tab elements (107) are integrally formed on the bottom edge of the support frame (102) with the clamping elements (106). These tab elements (107) may be coated or otherwise covered with some material having a high coefficient of friction, such as a silicon rubber material, to prevent the bottom edge of the support frame (102) from slipping when the stand assembly (100) is deployed and used in a portrait orientation.

Moreover, the contact edges E1 and E2 of the kickstand element (130) can be may be coated or otherwise covered with some material having a high coefficient of friction, such as a silicon rubber material, to prevent the contact edges E1 and E2 of the kickstand (130) from slipping when the stand assembly (100) is deployed and used in the landscape or portrait orientations. Finally, with reference to FIGS. 1, 2, 3, 4, and 6, for example, a corner edge (108E) of the support frame (102) may be coated or otherwise covered with some material having a high coefficient of friction, such as a silicon rubber material, along the entire length or a portion of the length of the sidewall (108) to prevent the edge (108E) of the support frame (102) from slipping when deployed and used in the landscape orientation.

Figure 10:
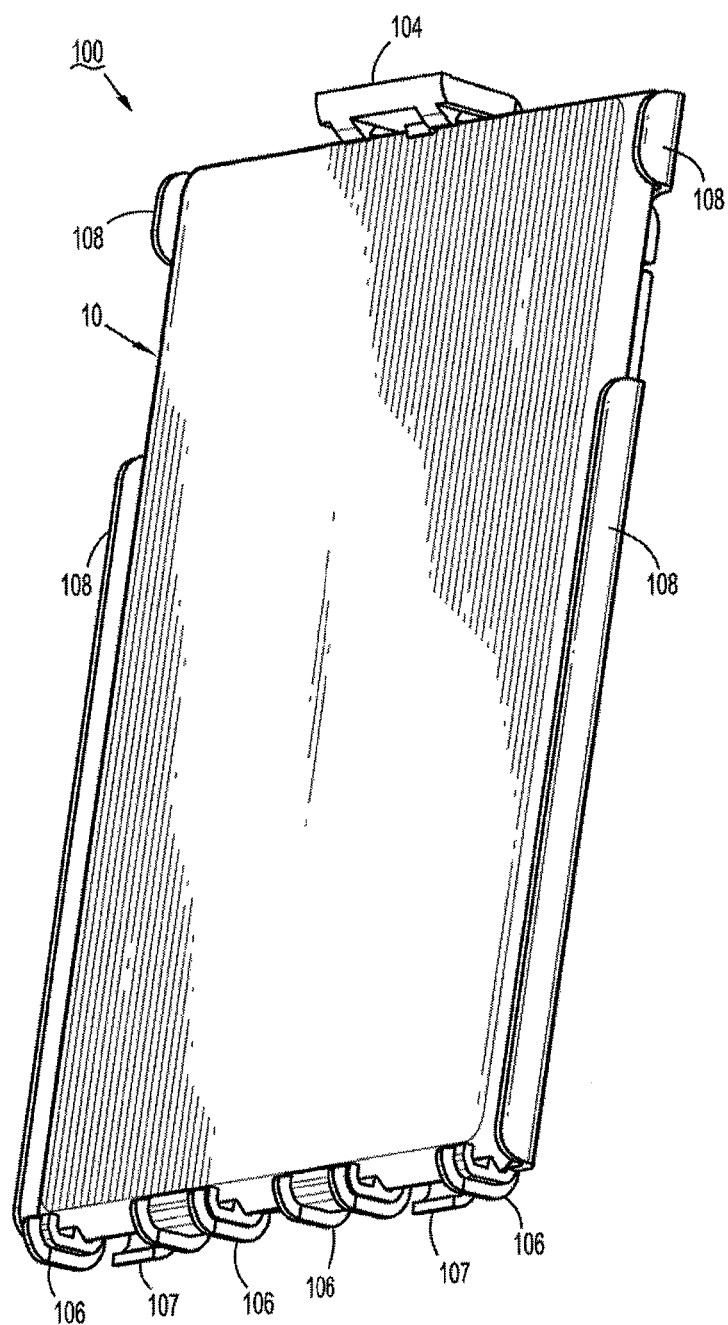
FIG. 10 is a front perspective view showing use of the adjustable stand assembly of FIG. 2 as a protective cover for the electronic device coupled face down to as front side of the stand assembly, according to exemplary embodiment of the invention.

In other exemplary embodiments of the invention, the stand assembly (100) of FIG. 1 is designed for use as a protective cover. For instance, FIG. 10 is a front perspective view showing use of the stand assembly (100) of FIG. 2 as a protective cover for the electronic device (10), when the electronic device (10) is coupled face down to a front side of the support frame (102), according to exemplary embodiment of the invention. As depicted in FIG. 1, raised rib elements (109) are formed on a front surface of the support frame (102), longitudinally extending in parallel with the sidewall edges (108) of the support frame (102). The raised rib elements (109) are disposed and configured to make contact to the front surface edge of the frame/cover (11) of the electronic device (10) when the electronic device (10) is mounted face down (as shown in FIG. 10), so that the display screen (12) of the electronic device (10) is maintained offset from, and does not make contact to, the front surface of the support frame (102). This prevents the display screen (12) from being scratched or otherwise damaged by undesired contact with the surface of the support frame (102).

Referring, again to FIG. 3, it is to be appreciated that when the kickstand assembly (120) is in a stowed position (as shown in FIG. 3), the longitudinally extending raised edges (110) formed on the rear surface of the support frame (102) provide an offset having a height that is at least the thickness of the stand assembly (120) in the stowed position, such that the upper edges of the longitudinally extending raised edges (110) effectively provide a planar level surface so that the stand assembly (100) can lay flat on its rear surface when the adjustable kickstand assembly (120) is in the stowed position.

Figure 11:
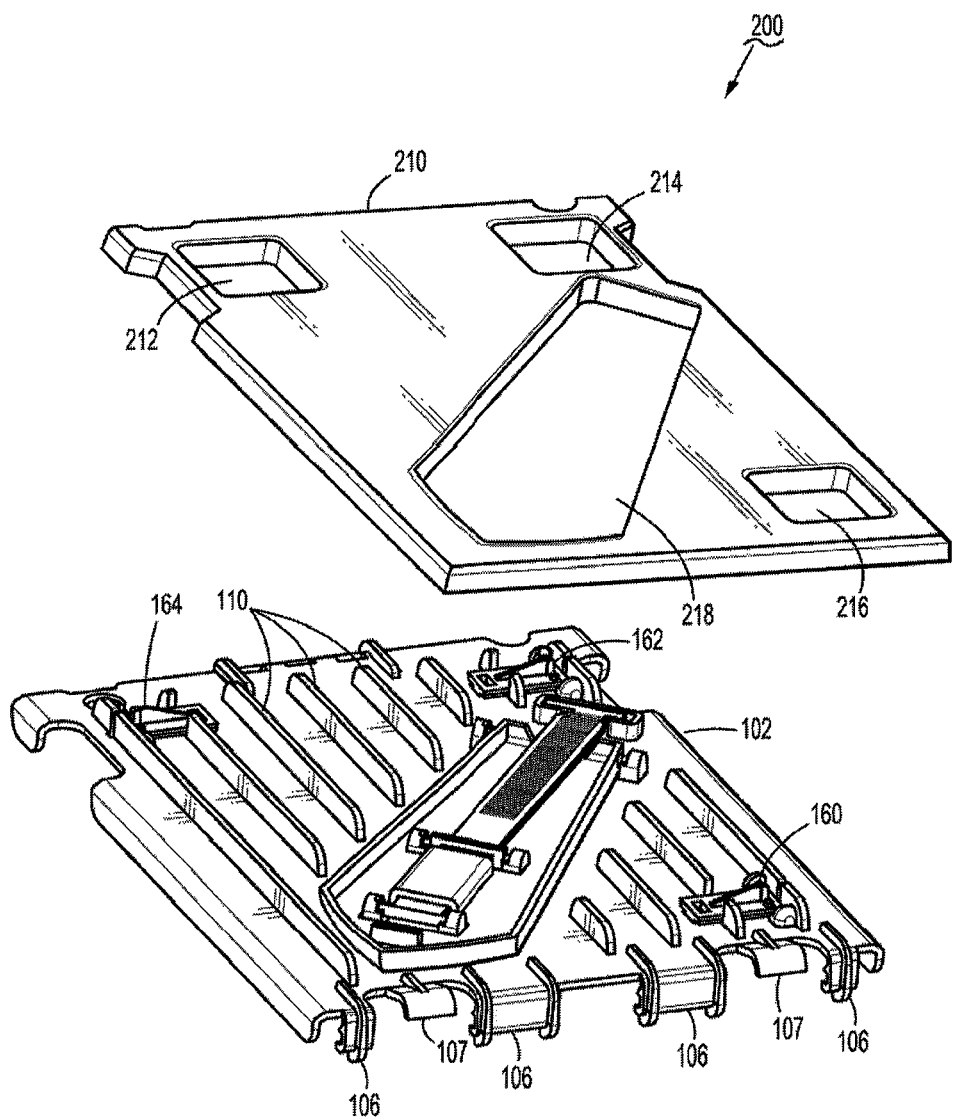
FIG. 11 is an exploded perspective view of an adjustable stand assembly according to another exemplary embodiment of the invention.
Figure 12:
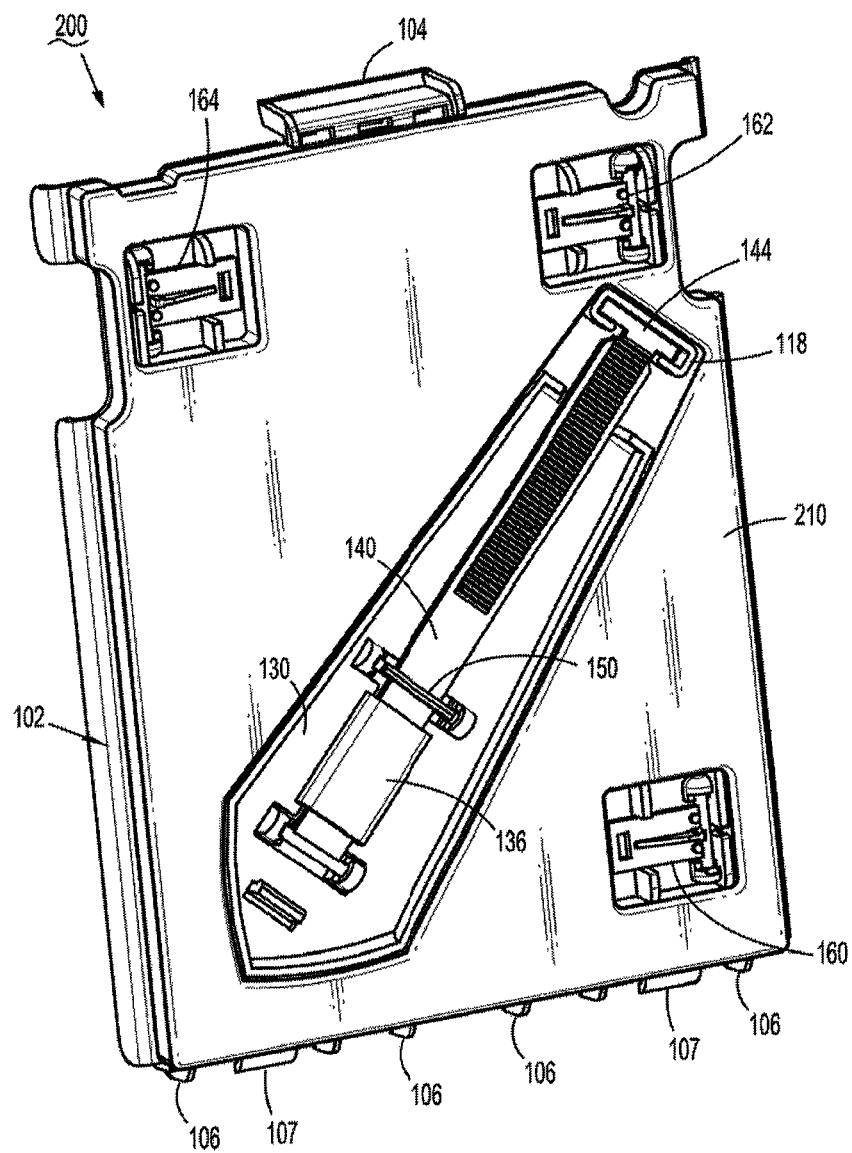
FIG. 12 is a rear perspective view of the adjustable stand assembly of FIG. 11 in an assembled configuration, according to another exemplary embodiment of the invention.

In another exemplary embodiment of the invention, as separate back plate can be coupled to the rear surface of the support frame (102) to cover the longitudinally extending raised edges (110) and provide a more smooth aesthetic profile for the stand assembly. For instance, FIG. 11 is an exploded perspective view of a stand assembly (200) according to another exemplary embodiment of the invention, showing a back cover plate (210) that is employed to cover the rear surface of the support frame (102). In addition, FIG. 12 is as rear perspective view of the stand assembly (200) of FIG. 11 showing the hack cover plate (210) in an assembled configuration, according to another exemplary embodiment of the invention. As depicted in FIGS. 11 and 12, the back cover plate (210) includes a plurality of cutout regions (212), (214), (216) and (218) to provide room for keyboard riser elements (164), (162), (160) and the adjustable kickstand assembly (120), in this embodiment, the longitudinally extending raised, edges (110) serve as supporting ridges to support the back cover plate (210) when attached to the rear surface of the support frame (102).

The back cover plate (210) may be removably attached to the rear surface of the support frame (102) or the back cover plate (210) may be fixedly and permanently attached to the rear surface of the support frame (102). In embodiments where the back cover plate (210) is removable, the cover plate (210) may be designed to removably couple to the front side of the support frame (102) of the stand assembly (100) when the electronic device (10) is mounted in the support frame (102). Advantageously, with this design, the cover plate (210) can serve as a protective cover plate to protect the electronic device (10) when the electronic device (10) is mounted face up (FIG. 2) or mounted face down (FIG. 10) on the support frame (102).

Moreover, as previously discussed above with reference to FIGS. 3 and 4, the keyboard riser elements (160) and (162) (as shown in FIGS. 11 and 12) may be deployed to maintain the stand assembly (100) at a low profile angle (e.g., 8 degrees) in a landscape orientation with the kickstand assembly (120) in a stowed position, to thereby provide an ergonomic design for ease of typing in landscape mode. Moreover, in another exemplary embodiment as shown in FIGS. 11 and 12, an additional keyboard riser element (164) is provided so that keyboard riser elements (162) and (164) may be deployed to maintain the stand assembly (100) at a low profile angle (e.g., 8 degrees) in a portrait orientation with the kickstand assembly (120) in a stowed position, to thereby provide an ergonomic design for ease of typing in portrait mode.

It is to be understood that adjustable stand assemblies described herein, and the various components thereof, may be made with any suitable material, such as plastic materials, that are commonly used for fabricating, stand assemblies and holders for electronic devices. For instance, stand assemblies according to exemplary embodiments of the invention may be fabricated using ABS (Acrylonitrile Butadiene Styrene) thermoplastic materials using known injection molding, and fabrication methods. Moreover, those of ordinary skill in the art will readily appreciate and understand that the shapes, dimensions and configurations of stand assemblies according to exemplary embodiments of the invention will vary depending on the shapes and sizes of the electronic devices for which they are designed. These electronic devices have various types of I/O ports (e.g., microphone jacks), camera lenses, and control buttons that must be taken into consideration when designing and positioning the clamp elements and protective sidewalls elements, for example, so that such elements do not impede or block access to the ports, lenses and control buttons.

Although exemplary embodiments of the present invention have been described herein with reference to the accompanying figures, it is to be understood that the invention is not limited to those precise embodiments, and that various other changes and modifications may be made therein by one skilled in the art without departing from the scope of the appended claims.

What is claimed is:

1. A stand assembly for a portable electronic device, comprising:
    a support frame having a plurality of resilient clamping elements configured to removably couple a portable electronic device to a front surface of the support frame; and
    an adjustable kickstand assembly, coupled to a rear surface of the support frame, wherein the adjustable kickstand assembly comprises a kickstand element that is adjustable from a stowed position to at least one deployed angular position relative to a rear surface of the support frame, wherein in the at least one deployed angular position, the stand assembly can be positioned in either a landscape orientation or a portrait orientation without having to change the at least one deployed angular position of the adjustable kickstand assembly;
    wherein the adjustable kickstand assembly comprises:
    an adjuster bar element; and
    an adjuster bar lock element,
    wherein the adjuster bar lock element is pivotally connected to the kickstand element, and
    wherein the adjuster bar element slideably engages the adjuster bar lock element to adjust an incline angle of the kickstand element relative to the rear surface of the support frame.

2. The stand assembly of claim 1, wherein the kickstand element is an easel-leg-type support element having first and second contact edges which make contact with a support surface when the stand assembly is deployed in a landscape orientation and a portrait orientation, respectively.

3. The stand assembly of claim 1, wherein the support frame comprises at least two riser elements disposed on a rear surface of the support frame, which can be engaged to provide an incline angle of 8 degrees or less when the stand assembly is positioned for use in a landscape orientation.

4. The stand assembly of claim 1, wherein the support frame comprises at least two riser elements disposed on a rear surface of the support frame, which can be engaged to provide an incline angle of 8, degrees or less when the stand assembly is positioned for use in a portrait orientation.

5. The stand assembly of claim 1, wherein the kickstand element comprises a first aperture that is configured to engage a clamp connector element formed on a rear surface of the support frame to lock the kickstand element in a stowed position.

6. The stand assembly of claim 1, wherein the adjuster bar element comprises a t-shaped tab element formed on a first end thereof, wherein the t-shaped tab element is configured to be inserted into a cradle connector on the rear surface of the support frame to fixedly secure the first end of the adjuster bar element to the rear surface of the support frame when the kickstand element is in a stowed position.

7. The stand assembly of claim 1, wherein the adjuster bar element comprises a slotted region comprising a series of raised edges that form parallel slots on opposing sides of the slotted region of the adjuster bar element.

8. The stand assembly of claim 7, wherein the adjuster bar lock element comprises a slot having first and second raised edges formed on first and second inner surfaces that define the slot, wherein the adjuster bar element slideably engages the adjuster bar lock element by slidably moving the adjuster bar element back and forth through the slot of the adjuster bar lock element to engage the parallel slots of the slotted region of the adjuster bar element with the first and second raised edges of the first and second inner surfaces of the slot.

9. The stand assembly of claim 1, further comprising a back cover plate that is removably attached to the rear surface of the support frame, wherein the back cover plate is configured to connect to a front side of the support frame to cover an electronic portable electronic device mounted on the front surface of the support frame.

10. A device, comprising:
    a frame; and
    an adjustable kickstand assembly, coupled to a rear surface of the frame, wherein the adjustable kickstand assembly comprises a kickstand element that is adjustable from a stowed position to at least one deployed angular position relative to a rear surface of the frame, wherein in the at least one deployed angular position, the frame can be positioned in either a landscape orientation or a portrait orientation without having to change the at least one deployed angular position of the adjustable kickstand assembly;
    wherein the adjustable kickstand assembly comprises:
    an adjuster bar element; and
    an adjuster bar lock element,
    wherein the adjuster bar lock element is pivotally connected to the kickstand element, and
    wherein the adjuster bar element slideably engages the adjuster bar lock element to adjust an incline angle of the kickstand element relative to the rear surface of the frame.

11. The device of claim 10, wherein the kickstand element is an easel-leg-type element having first and second contact edges which make contact with a surface when the frame is deployed in a landscape orientation and a portrait orientation, respectively.

12. The device of claim 10, wherein the kickstand element comprises a first aperture that is configured to engage a clamp connector element formed on a rear surface of the frame to lock the kickstand element in a stowed position.

13. The device of claim 10, wherein the adjuster bar element comprises a t-shaped tab element formed on a first end thereof, wherein the t-shaped tab element is configured to be inserted into a cradle connector on the rear surface of the frame to fixedly secure the first end of the adjuster bar element to the rear surface of the frame when the kickstand element is in a stowed position.

14. The device of claim 10, wherein the adjuster bar element comprises a slotted region comprising a series of raised edges that form parallel slots on opposing sides of the slotted region of the adjuster bar element.

15. The device of claim 14, wherein the adjuster bar lock element comprises a slot having first and second raised edges formed on first and second inner surfaces that define the slot, wherein the adjuster bar element slideably engages the adjuster bar lock element by slidably moving the adjuster bar element back and forth through the slot of the adjuster bar lock element to engage the parallel slots of the slotted region of the adjuster bar element with the first and second raised edges of the first and second inner surfaces of the slot.

16. The device of claim 10, wherein the frame comprises a plurality of resilient clamping elements configured to removably couple a portable electronic device to a front surface of the frame.

17. A device, comprising:
a frame; and
an adjustable kickstand assembly, coupled to a rear surface of the frame, wherein the adjustable kickstand assembly comprises a kickstand element that is adjustable from a stowed position to at least one deployed angular position relative to a rear surface of the frame which allows the frame to be positioned in one of a landscape orientation and a portrait orientation;
wherein the adjustable kickstand assembly comprises:
an adjuster bar element; and
an adjuster bar lock element,
wherein the adjuster bar lock element is pivotally connected to the kickstand element, and
wherein the adjuster bar element slideably engages the adjuster bar lock element to adjust an incline angle of the kickstand element relative to the rear surface of the frame.

18. The device of claim 17, wherein the adjuster bar element comprises a slotted region comprising a series of raised edges that form parallel slots on opposing sides of the slotted region of the adjuster bar element.

19. The device of claim 18, wherein the adjuster bar lock element comprises a slot having first and second raised edges formed on first and second inner surfaces that define the slot, wherein the adjuster bar element slideably engages the adjuster bar lock element by slidably moving the adjuster bar element back and forth through the slot of the adjuster bar lock element to engage the parallel slots of the slotted region of the adjuster bar element with the first and second raised edges of the first and second inner surfaces of the slot.

* * * * *